United States Patent
Harrison et al.

(10) Patent No.: US 6,930,889 B2
(45) Date of Patent: Aug. 16, 2005

(54) CIRCUIT BOARD AND SLOT CONNECTOR ASSEMBLY

(75) Inventors: Joe A. Harrison, Olympia, WA (US); Edward R. Stanford, Dupont, WA (US); Daniel S. Kingsley, Steilacoom, WA (US); Kelli A. Wise, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 09/811,063

(22) Filed: Mar. 16, 2001

(65) Prior Publication Data

US 2002/0131243 A1 Sep. 19, 2002

(51) Int. Cl.[7] .................................................. H01R 9/00
(52) U.S. Cl. .................... 361/774; 361/772; 361/777; 361/778; 361/785; 361/791
(58) Field of Search ................................. 361/767, 772, 361/774, 777, 778, 785, 789–791, 737, 747–748, 803, 736, 786, 775, 801, 802, 759, 740, 741, 756, 787–788; 439/325, 327–328, 629–631

(56) References Cited

U.S. PATENT DOCUMENTS

| | | | | |
|---|---|---|---|---|
| 4,241,381 A | * | 12/1980 | Cobaugh et al. ............. | 361/785 |
| 4,382,271 A | * | 5/1983 | Villemont et al. .......... | 361/721 |
| 4,892,487 A | * | 1/1990 | Dranchak et al. ........... | 439/260 |
| 5,353,191 A | * | 10/1994 | Volz et al. ................... | 361/690 |
| 5,440,755 A | * | 8/1995 | Harwer et al. .............. | 710/315 |
| 5,629,839 A | * | 5/1997 | Woychik ..................... | 361/803 |
| 5,709,555 A | * | 1/1998 | Noschese ...................... | 439/79 |
| 5,833,478 A | * | 11/1998 | Tseng et al. ................. | 439/326 |
| 6,017,248 A | * | 1/2000 | Pan et al. .................... | 439/681 |
| 6,097,883 A | * | 8/2000 | Dell et al. ................... | 395/282 |
| 6,135,781 A | * | 10/2000 | Pope et al. .................... | 439/59 |
| 6,162,091 A | * | 12/2000 | Kurotori et al. ............ | 439/567 |
| 6,191,022 B1 | * | 2/2001 | Creswick .................... | 438/612 |
| 6,210,195 B1 | * | 4/2001 | Ma ............................. | 439/327 |
| 6,227,898 B1 | * | 5/2001 | Meng et al. ................. | 439/377 |
| 6,231,364 B1 | * | 5/2001 | Liu ............................. | 439/326 |
| 6,266,252 B1 | * | 7/2001 | Karabatsos ................. | 361/788 |
| 6,276,943 B1 | * | 8/2001 | Boutros et al. ............ | 439/76.1 |
| 6,402,566 B1 | * | 6/2002 | Middlehurst et al. ..... | 439/699.1 |
| 6,413,109 B1 | * | 7/2002 | Kobayashi et al. ......... | 439/326 |
| 6,551,120 B2 | * | 4/2003 | Daskalakis et al. ......... | 439/328 |
| 2002/0046762 A1 | * | 4/2002 | Rossi .......................... | 136/201 |
| 2003/0152128 A1 | * | 8/2003 | Verhaegen ................... | 374/30 |

* cited by examiner

Primary Examiner—Amir Zarabian
Assistant Examiner—Thanh Y. Tran
(74) Attorney, Agent, or Firm—Trop, Pruner & Hu, P.C.

(57) ABSTRACT

A circuit board includes a substrate and electrical contacts to mate with a slot connector. The contacts include a first set of contacts that are associated with the communication of power and second set of contacts that are associated with the communication of signals and are not used to communicate power. Adjacent contacts of the first set have a first spacing, and adjacent contacts of the second set have a second spacing different from the first spacing. The circuit board has a retention profile to engage a retention mechanism of the slot connector. A housing of the slot connector may be made from a material that has a thermal conductivity of at least 0.27 W/m·K, and the slot connector housing may include fins that are formed on the slot connector to conduct heat away from circuitry of the circuit board.

7 Claims, 4 Drawing Sheets

CIRCUIT BOARD AND SLOT CONNECTOR ASSEMBLY

BACKGROUND

The invention generally relates to a circuit board and slot connector assembly.

A typical computer system (a server, for example) includes removable circuit boards that are plugged into a motherboard of the system via various slot connectors. In this manner, each slot connector is mounted on the motherboard for purposes of electrically and mechanically coupling an associated circuit board to the motherboard.

A particular slot connector may include an opening, or slot, for receiving the circuit board, and inside the slot, the slot connector includes resilient electrical contacts to establish contact with corresponding electrically conductive fingers, or pads, of the circuit board for purposes of electrically coupling circuitry of the circuit board to circuitry of the motherboard. As an example, these removable circuit boards may include memory cards as well as voltage regulator module cards.

The slot connector may include a mechanism to physically secure the received circuit board to the slot connector. For example, a slot connector for a memory card may include levers that are located on the outside of the housing of the slot connector. These levers are rotated to lock a memory card (i.e., a removable circuit board) that is inserted into the slot connector in place. As another example, a slot connector that receives a voltage regulator module card (i.e., another circuit board) may include a retention clip that is mounted on the outside of the slot connector's housing. The retention clip fits over the corners of the voltage regulator module card and snaps into the connector housing to secure the card to the slot connector. For both of these arrangements, reserved space is needed on the motherboard at the ends of the connector housing to permit access to the levers/retention clip.

If a slot connector overheats, the housing of the slot connector may expand, an expansion that opens the slot that receives the circuit board. The opening of this slot, in turn, releases the tension that is exerted by the resilient electrical contacts of the slot connector on the corresponding electrical contact pads of the circuit board. As a result, the slot connector may no longer make sufficient electrical connections with the received circuit board, thereby causing the failure of these connections. This overheating may especially occur in connection with a voltage regulator module card that may communicate large currents to and from the card.

A conventional technique to prevent overheating of the slot connector includes increasing the sizes of the slot connector and associated circuit board (such as a voltage regulator module card, for example) to allow greater surface areas for the contact pads of the circuit board and the corresponding electrical contacts of the slot connector. However, due to the ever decreasing sizes of computer systems and the increasing power that is demanded by these computer systems, it may be desirable to minimize the size of the circuit board voltage regulator module card while providing sufficient thermal management properties for the voltage regulator module card.

Thus, there is a continuing need for an arrangement to address one or more of the problems that are stated above.

DETAILED DESCRIPTION

Figure 1:
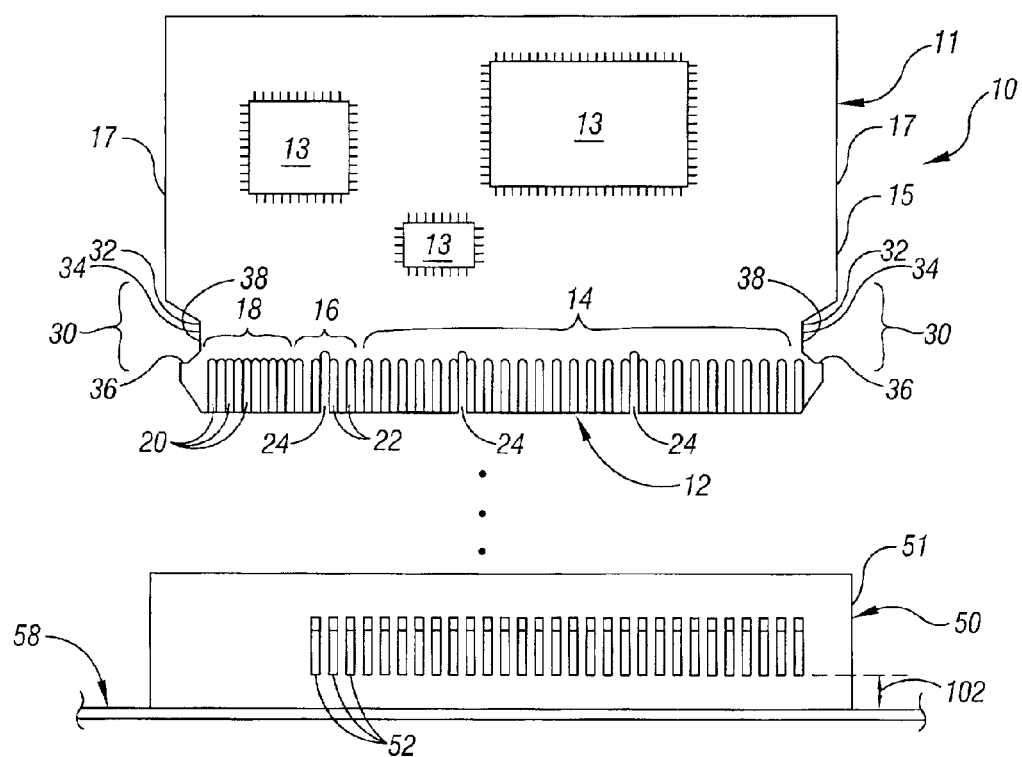
FIG. 1 is an exploded front view of an assembly that includes a circuit board and a slot connector according to an embodiment of the invention.

Referring to FIG. 1, an embodiment 10 of an assembly in accordance with the invention includes a removable circuit board 11 that may be inserted into a slot connector 50 for purposes of mechanically and electrically coupling the circuit board 11 to another circuit board 58 (a motherboard, for example). In this manner, the slot connector 50 includes spring-type electrical contacts (shown and described below) that are each hardwired (soldered, for example) to circuitry of the circuit board 58. These contacts of the slot connector 50 make electrical connections with corresponding electrically conductive fingers, or pads (pads 20 and 22, depicted as examples), of the circuit board 11 when the circuit board 11 is inserted into the slot connector 50. As an example, the circuit board 11 includes circuitry, such as semiconductor chips 13 (for example), that are mounted on and supported by an electrically nonconductive substrate 15 (a printed circuit board (PCB), for example). Alternatively, the circuitry may be in the form of an encapsulated circuit module 100 (see FIG. 4) that is supported by the substrate 15.

In some embodiments of the invention, the circuit board 11 may be a voltage regulator module card that communicates relatively large currents to and from the circuit board 11. As described below, the assembly 10 includes features that accommodate such large currents while removing sufficient heat away from a housing 51 of the slot connector 50 to prevent the slot connector 50 from "opening up" and breaking electrical connections with the circuit board 11 when the circuit board 11 is inserted into the slot connector 50.

Figure 2:
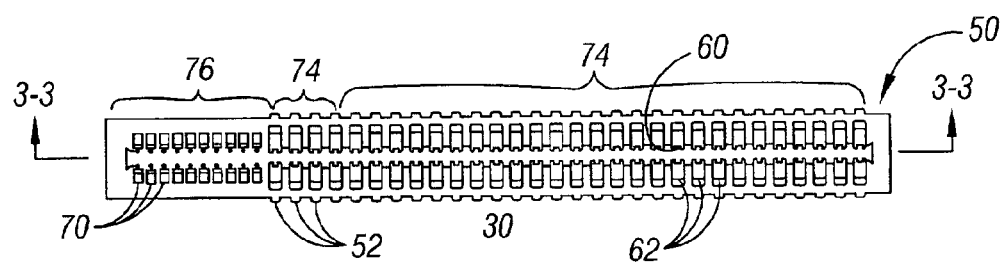
FIG. 2 is a top view of the slot connector of FIG. 1 according to an embodiment of the invention.

Referring both to FIGS. 1 and 2, the substrate 15 includes a contact edge 12 that is constructed to be inserted into a slot 60 (see FIG. 2) of the slot connector housing 51. The electrically conductive pads 20 and 22 of the circuit board 15 are formed near and extend to the contact edge 12 for purposes of contacting corresponding leaf spring contacts (contacts 62 and 70 depicted as examples) that line the interior of the slot 60 to contact the pads of the circuit board 11. It is understood that although not shown, the face (of the circuit board 11) that is not depicted in FIG. 1 may also have electrically conductive pads near the edge 12 to contact corresponding spring contacts inside the slot 60.

As described below, the assembly 10 has various features that minimize the overall size of the assembly 10 while preventing thermal buildup that otherwise may lead to failure of the electrical and/or mechanical connections between the slot connector 50 and the circuit board 11. It is assumed for the remainder of the description below that the circuit board 11 includes voltage regulation circuitry that receives voltages from the circuit board 58 and in response, provides regulated voltages to the circuit board 58. As an example, the circuit board 11 may be part of a voltage regulator module. However, circuit boards that include circuits other than voltage regulation circuitry fall within the scope of the invention.

Referring to FIG. 1, in some embodiments of the invention, the electrically conductive pads of the circuit board 11 include pads 22 for communicating supply voltages to and from the circuit board 11 in connection with furnishing power to the circuit board 58 as well as other circuit boards and devices (not shown) that may be coupled to the circuit board 58. In general, in some embodiments of the invention, these supply voltages are DC voltages and include voltages that are received by the circuitry of the circuit board 11 for purposes of voltage conversions and include voltages that are furnished by the circuitry of the circuit board 11 as a result of these voltage conversions. The pads 22 may be subdivided into two groups: a group 16 of pads 22 that includes voltage input pads to receive DC input voltages for conversion as well as ground pads that are associated with the voltage input pads; and a group 14 of pads 22 that includes voltage output pads to provide the regulated DC output voltages as well as ground pads that are associated with the voltage output pads.

The electrically conductive pads of the circuit board 11 may also include a group 18 of pads 20 for establishing signal communication between the circuitry of the circuit board 11 and the circuit board 58. Thus, the pads 20 are generally not used as conduits to communicate power. As an example, one of the pads 20 may communicate a power good signal, another one of the pads 20 may communicate a voltage regulator card enable signal, other pads 20 may be used for other signals that are used to control the regulation of power by the circuitry of the circuit board 11, etc. In some embodiments of the invention, the contact edge 12 of the substrate 15 includes notches 24 for purposes of allowing corresponding webbed portions of the housing 51 to protrude into the notches 24 to support the circuit board 11, to provide contact support for high current conditions and to prevent insertion of the circuit board 11 into the slot connector 50 in the wrong orientation.

As depicted in FIG. 1, in some embodiments of the invention, the pitch (i.e., the distance between the center points of adjacent pads) of the pads 22 may be significantly greater than the pitch of the pads 20, a difference that permits a lower density for the pads 22. This lower density, in turn, means that the pads 22 generate less heat than if the pads 22 had the pitch of the pads 20. However, as a result of this arrangement, each pad 22 effectively occupies more space along the contact edge 12 of the substrate 15 than each pad 20. Therefore, the space that is consumed by the pads 22 tends to increase the length of the edge 12 and thus, tends to increase the longitudinal length of the slot connector 50. However, due to the lower pitch of the pads 20, the pads 20 tend to minimize the space along the edge, thereby tending to decrease the length of the edge 12.

The use of two different pitches along the contact edge is different from a conventional circuit board that uses the same pitch for all pads. However, the different pitches of the pads 20 and 22 permits the smaller and larger pitches to be used where needed, thereby minimizing the length of the edge 12 and enhancing the thermal characteristics of the circuit board 11. As an example, in some embodiments of the invention, the pitch of the pads 20 may be governed by the Peripheral Component Interconnect (PCI) standard, and the pitch of the pads 22 may be governed by an Industry Standard Architecture (ISA) standard. The PCI Specification is available from The PCI Special Interest Group, Portland, Oreg. 97214. As an example, in some embodiments of the invention, the pitch of the pads 20 may be approximately 0.050 inches, and the pitch of the pads 22 maybe approximately 0.1 inches.

Figure 3:
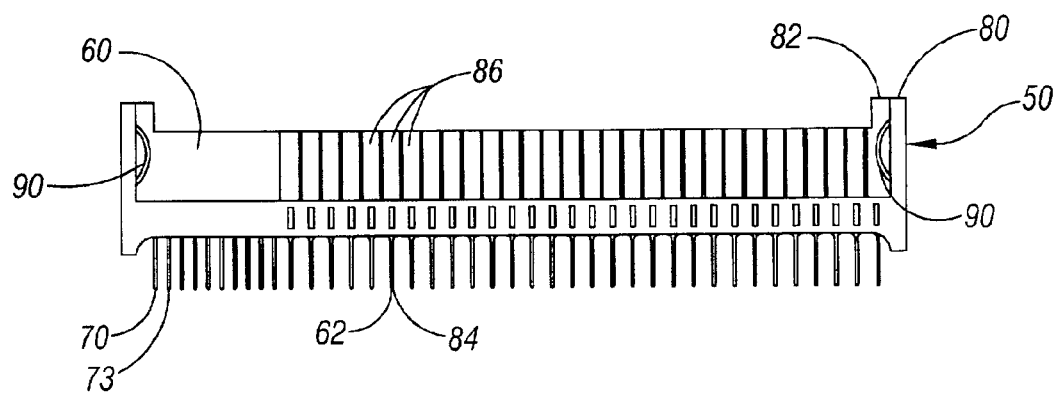
FIG. 3 is a cross-sectional view of the slot connector taken along line 3—3 of FIG. 2 according to an embodiment of the invention.
Figure 4:
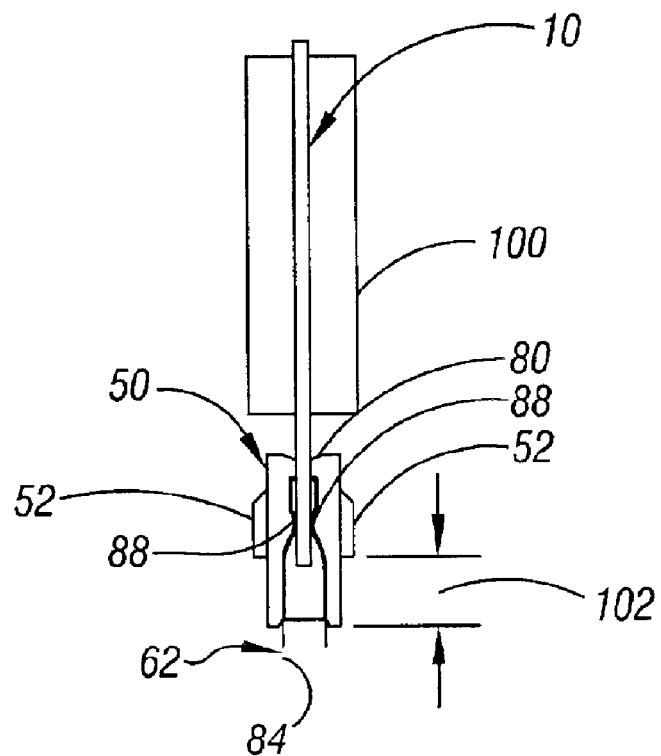
FIG. 4 is a cross-sectional side view of a slot connector and circuit board assembly according to an embodiment of the invention.

Referring to FIGS. 3 and 4, in some embodiments of the invention, each contact 62 of the slot connector 50 has a resilient curved portion 88 that contacts one of the pads 22 when the circuit board 11 is inserted into the slot connector 50. The curved portion 88 transitions into a pin portion 84 (of the contact 62) that extends into a corresponding opening in the circuit board 58 where the pin portion 84 is soldered to a conductive trace (not shown) of the circuit board 58. The contacts 62 reside inside corresponding slots 86 formed in the housing 51.

Referring to FIGS. 3 and 4, similar to each contact 62, each contact 70 of the slot connector 50 has a resilient curved portion (similar to the curved portion 88 of the contact 62) that contacts one of the pads 20 when the circuit board 11 is inserted into the slot connector 50. The contact has a lower pin portion 73 that extends into a corresponding opening in the circuit board 58 to permit the pin portion 73 to be soldered to a conductive trace (not shown) of the circuit board 58. As depicted in FIG. 4, in some embodiments of the invention, similar to the corresponding pads 20 and 22, the pins 73 are spaced apart at a pitch that is less than the pitch of the pins 84.

Besides allowing more space for the pads 22, the assembly 10 may have other features to reduce the amount of heat that is absorbed by the connector housing 51. For example, referring back to FIG. 1, in some embodiments of the invention, the connector housing 51 may include exterior vertical fins 52 that are regularly spaced apart along the two longitudinal sidewalls of the connector housing 51. Each fin 52 extends in a direction that is orthogonal the circuit board 58, and the fins 52 are generally parallel to each other.

As compared to a conventional slot connector, the fins 52 provide more surface area for cooling the connector housing 51 to enhance the housing's ability to prevent heat from building up in the connector housing 51. As shown, in some embodiments of the invention, a clearance, or air gap 102, exists between the bottom of each fin 52 and the circuit board 58. The air gap 102 prevents the fins 52 from acting as thermal bridges to conduct heat from the connector housing 51 to the circuit board 58 or vice versa. Thus, the air gap 102 isolates the fins 52 from the circuit board 58 to allow ambient air to remove heat from the contacts of the slot connector housing 51. In some embodiments of the invention, the air gap 102 may be approximately greater than or equal to about 0.25 inches. As a more specific example, the air gap 102 may be near about ⅜ inches in some embodiments of the invention.

In some embodiments of the invention, another feature of the slot connector 50 that enhances the thermal properties of the connector 50 is the material that is used to form the connector housing 51. In this manner, in some embodiments of the invention, the connector housing 51 is formed from a material that has a substantially high thermal conductivity (as compare to conventional plastic materials) to aid in distributing the heat. As an example, in some embodiments of the invention, the housing 51 is formed from a liquid crystal polymer (LCP) material, such as an LCP material called Zenite that is made by Dupont and has a thermal conductivity of approximately 0.27 W/m·K. A material that has a thermal conductivity greater than 0.27 W/m·K may be used. Likewise, a material that has a thermal conductivity less than 0.27 W/m·K may be used.

Referring to FIG. 1, in some embodiments of the invention, the substrate 15 of the circuit board 11 has two side edges 17 that each contain a profile 30 for engaging the slot connector 50 when the circuit board 11 is inserted into the slot 60. As an example, in some embodiments of the invention, the profile 30 may form a barb or hook that is engaged by a catch mechanism that is located inside the slot 60, as described below. The side edges 17 extend along a direction that is generally orthogonal from the direction along which the contact edge 12 extends.

More particularly, in some embodiments of the invention, two mechanisms (described below) that are attached to the housing 51 and are located inside the slot 60 engage the profiles 30 when the circuit board 11 is inserted into the slot 60 for purposes of securing the circuit board 11 to the connector 50. For example, in some embodiments of the invention, the slot connector 50 includes leaf springs 90 that are disposed inside the slot 60 and attached to the connector housing 51 at the longitudinal ends of the slot 60, as depicted in FIG. 3. Referring to a more detailed depiction of one of the leaf springs 90 and one of the profiles 30 in FIG. 5, when the circuit board 11 is fully seated inside the slot 60, a bowed section 91 of the leaf spring 90 engages the corresponding profile section 30 to hold the circuit board 11 in place inside the slot connector 50.

In some embodiments of the invention, the leaf springs 90 may be replaced by plastic latches. These plastic latches may or may not be an integral part of the connector housing 51, depending on the particular embodiment of the invention. In this manner, when part of the connector housing 51, each leaf spring 90 may be replaced by an extension of the connector housing 51, an extension that extends inside the slot 60 to form a corresponding latch and bow according to the profile of the bowed section 91, for example.

Figure 5:
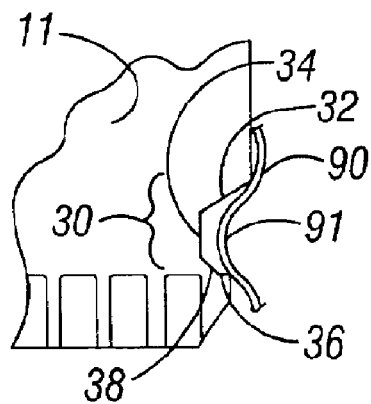
FIG. 5 is a more detailed schematic diagram of a portion of the assembly of FIG. 1 depicting a latching mechanism according to an embodiment of the invention.

As depicted in FIG. 5, in some embodiments of the invention, the profile 30 generally forms a barb or hook in that the vertical edge 17 of the substrate 15 transitions into a beveled edge 32 that extends downwardly and inwardly toward the substrate 15. The beveled edge 32 guides the bowed section 91 into the notch to secure the circuit board 15 to the slot connector 50. The beveled edge 32 transitions into a vertical edge 34 that, in turn, transitions into a horizontal edge (parallel with the edge 12) to complete the notch. Besides guiding the bowed section 91 into the notch, the beveled edge 32 provides a resistance to the removal of the circuit board 11 from the slot connector 50.

Figure 6:
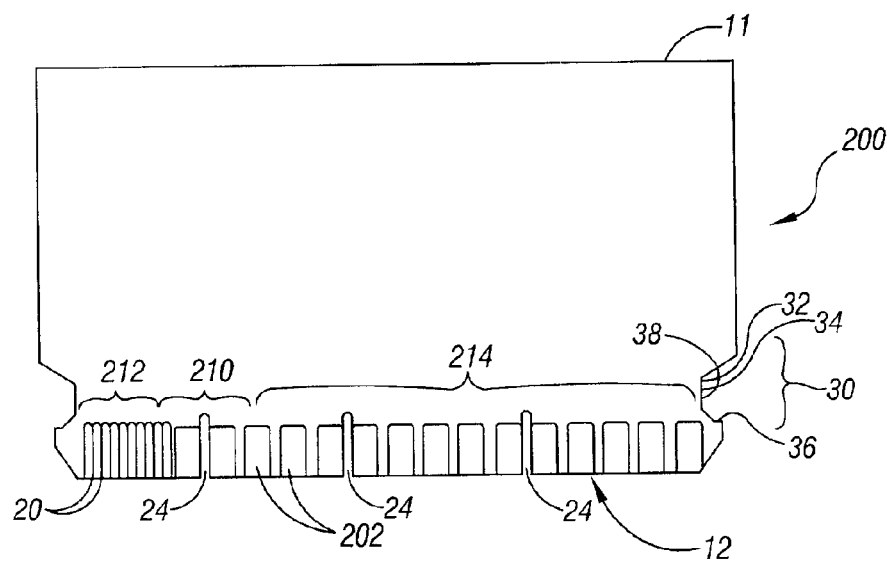
FIG. 6 is a front view of a circuit board according to an embodiment of the invention.
Figure 7:
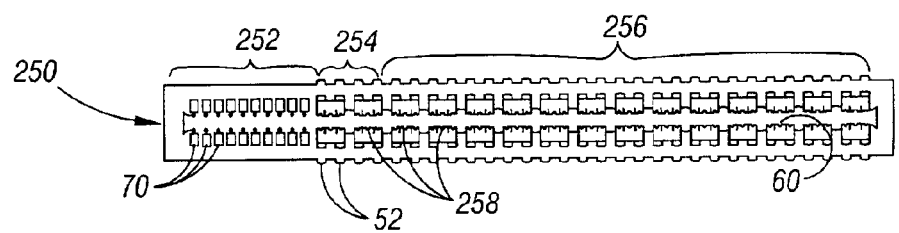
FIG. 7 is a top view of a slot connector for use with the circuit board of FIG. 6 according to an embodiment of the invention.

Referring to FIG. 6, other embodiments are within the scope of the following claims. For example, in some embodiments of the invention, a circuit board 200 may be used in place of the circuit board 11. The circuit board 200 has a similar design to the circuit board 11 except that the circuit board 200 has contact pads 202 that replace the contact pads 24 of the circuit board 11. The contact pads 202 have approximately twice the pitch of the contact pads 24, and each pad 24 occupies significantly more area than the pad 22. This arrangement permits each pad 24 to have significantly less resistance that each pad 22, thereby reducing the amount of heat that radiates from each pad.

The circuit board 200 mates with a slot connector 250 that replaces the slot connector 50. The slot connector 250 has a similar design to the slot connector 50 except that the slot connector 250 has leaf spring contacts 258 that are sized appropriately and are spaced at the appropriate pitch to receive the pads 202.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A circuit board comprising:

a substrate; and electrical contacts to releasably mate with contact springs of a slot connector in response to the substrate being inserted into a slot of the slot connector, the contacts comprising a first set of at least three uniformly spaced contacts to communicate power and a second set of at least three uniformly spaced contacts to communicate signals and not to communicate power, adjacent contacts of the first set being separated by a first distance and adjacent contacts of the second set being separated by a second distance different from the first distances, wherein no intervening contact exists between any two adjacent contacts of the first set.

2. The circuit board of claim 1, wherein the first distance is approximately half of the second distance.

3. The circuit board of claim 1, wherein the substrate comprises an edge to be inserted into a slot connector housing, and the first and second set of contacts are formed on the edge.

4. The circuit board of claim 1, wherein the first distance establishes a pitch of approximately 0.05 inches and the second distance establishes a pitch of approximately 0.10 inches.

5. The circuit board of claim 1, further comprising:

power regulation circuitry mounted on the substrate and in electrical communication with the first set of contacts to regulate voltages provided by the first set of contacts and not regulate any voltages provided by the second set of contacts.

6. The circuit board of claim 1, wherein the contact springs comprise leaf springs.

7. The circuit board of claim 6, wherein bowed portions of the leaf springs contact the circuit board.

* * * * *